United States Patent [19]
Dibrino et al.

[11] Patent Number: 5,920,489
[45] Date of Patent: Jul. 6, 1999

[54] METHOD AND SYSTEM FOR MODELING THE BEHAVIOR OF A CIRCUIT

[75] Inventors: Michael T. Dibrino, Austin, Tex.; David M. Wu, Beaverton, Oreg.

[73] Assignee: International Business Machines Corporation, Armonk, N.Y.

[21] Appl. No.: 08/642,292

[22] Filed: May 3, 1996

[51] Int. Cl.$^6$ .................................................. G06F 9/455
[52] U.S. Cl. .................... 364/578; 364/580; 364/490; 371/24; 371/71; 395/183.09
[58] Field of Search ...................... 364/578, 579, 364/580, 488, 490; 371/22.6, 24, 25.1, 26, 65, 71; 395/920, 183.01, 183.08, 183.09

[56] References Cited

U.S. PATENT DOCUMENTS

| | | | |
|---|---|---|---|
| 5,084,824 | 1/1992 | Lam et al. | |
| 5,210,699 | 5/1993 | Harrington | |
| 5,625,803 | 4/1997 | McNelly et al. | 395/500 |
| 5,675,502 | 10/1997 | Cox | 364/490 |
| 5,701,254 | 12/1997 | Tani | 364/489 |
| 5,701,443 | 12/1997 | Oguma et al. | 364/578 |

OTHER PUBLICATIONS

Blanco et al., "Dynamic Random Access Memory . . . ," IBM Technical Disclosure Bulletin, vol. 36, No. 07, Jul. 1993, pp. 7–12.

Dibrino et al., "Automatic Fault Model Generation," IBM Technical Disclosure Bulletin, vol. 36, No. 11, Nov. 1993, pp. 197–198.

Dibrino et al., "Hierarchical Fault Model Generation . . . ," IBM Technical Disclosure Bulletin, vol. 37, No. 02B, Feb. 1994, pp. 615–620.

"Test Pattern Generation for Circuits with Orthogonal Inputs," IBM Technical Disclosure Bulletin, vol. 37, No. 03, Mar. 1994.

Wu et al., "Automatic Fault Model/Logic Model Generation . . . ," 1993 IEEE, pp. 148–151.

Wu et al., "AutoMod–An Automatic Fault Model/BTR Generation and Verification for Ultra Larger Scale VLSI Circuits."

DiBrino et al., "An Illumination–Based Model of Stochastic Textures," SPIE vol. 1005, Optics, Illumination, and Image Sensing for Machine Vision III (1988), pp. 124–130.

Dibrino et al., "Fan–Node Oriented Fault Modeling Technique," IBM Technical Disclosure Bulletin, vol. 37, No. 02B, Feb. 1994, pp. 339–342.

*Primary Examiner*—Kevin J. Teska
*Assistant Examiner*—Russell W. Frejd
*Attorney, Agent, or Firm*—Anthony V. S. England; Brian F. Russell; Andrew J. Dillon

[57] ABSTRACT

A method and system for modeling the behavior of a circuit are disclosed. A list specifying a plurality of transistors within the circuit and interconnections between the plurality of transistors is provided. Each fan node within the circuit is identified, where a fan node is defined as a point of interconnection between two or more of the plurality of transistors from which multiple nonredundant current paths to power, ground, or an input of the circuit exist. A fan node equation set is constructed that expresses a logical state of each fan node of the circuit in response to various transistor gate signal states. In addition, an output node equation is constructed that expresses a logical state of an output node of the circuit in terms of selected fan node logical states and specified transistor gate signal states. In response to receipt of a set of states of inputs to the circuit, a logical state of the output node is determined utilizing the fan node equation set and the output equation in order to model behavior of the circuit.

18 Claims, 11 Drawing Sheets

METHOD AND SYSTEM FOR MODELING THE BEHAVIOR OF A CIRCUIT

BACKGROUND OF THE INVENTION

1. Technical Field

The present invention relates in general to a method and system for modeling the behavior of a circuit and in particular to a method and system for generating a logical fault model of an integrated circuit. Still more particularly, the present invention relates to a method and system for modeling the behavior of a circuit, which automatically generate a compact logical fault model of an integrated circuit from a circuit netlist description.

2. Description of the Related Art

A state-of-the-art VLSI (Very Large Scale Integration) integrated circuit, such as a microprocessor, can include between several hundred thousand and several million transistors, as well as other circuitry, all formed within a semiconducting substrate. Conventionally, VLSI integrated circuits have been designed utilizing a "book library" approach in which an integrated circuit is subdivided into a number of functional blocks. The circuit designer then selects circuit "books" within the design library, which each contain a limited number of transistors, to perform the functions of corresponding functional blocks within the integrated circuit. Utilizing the book library design methodology is rapid and economical because books within the design library can be utilized numerous times within a particular integrated circuit and reused in the design of other integrated circuits. A further advantage of the conventional book library approach is that the behavior of the integrated circuit can easily be modelled because the fault model for each book in the design library is known. Thus, the composite fault model for an integrated circuit design can be obtained simply by combining the individual fault models for the books incorporated within the integrated circuit design.

Although the conventional book library design methodology provides a relatively rapid and automated method for integrated circuit design, the conventional book library approach does not provide the integrated circuit optimization required to achieve the increasingly aggressive timing and functional goals of state-of-the-art VLSI integrated circuits. Accordingly, fully custom designs are now frequently utilized in order to maximize integrated circuit performance and minimize the semiconductor die area required to implement the design. Currently, facilities that allow integrated circuit designers to develop custom circuit designs at the transistor level or in a hierarchical circuit description are provided in commercially available VLSI design tools. VLSI design tools permit a circuit designer to perform circuit simulation and optimization to accomplish a custom design based upon a schematic entry of the components and interconnections within the integrated circuit. Furthermore, some VLSI design tools advantageously include facilities for testing the reliability and accuracy of the integrated circuit design.

Conventionally, testing an integrated circuit requires the construction of a logical fault model of the integrated circuit and the generation of a minimal set of test patterns to stimulate the circuit such that detectable faults can be exercised. Logical fault models are utilized since the number of possible different failures within the integrated circuit makes individual analysis of failures infeasible. Thus, failures are grouped together according to the logical effect of the faults on the functionality of the integrated circuit.

Although it is known in the art to automatically generate a logical fault model of a VLSI integrated circuit from a circuit netlist, such logical fault models typically employ a complex set of heuristics to determine equations which represent integrated circuit behavior. Because of the complexity of the circuit analysis performed by conventional automatic logical fault model generators, the application of conventional automatic logical fault model generators to custom-design integrated circuits including millions of transistors is too computation-intensive to be practical.

As should thus be apparent, an improved method and system for generating a fault model for a VLSI integrated circuit is needed which automatically generates a compact logical fault model of a VLSI integrated circuit from an input circuit netlist.

SUMMARY OF THE INVENTION

It is therefore one object of the present invention to provide a method and system for modeling the behavior of a circuit.

It is another object of the present invention to provide a method and system for generating a logical fault model of an integrated circuit.

It is yet another object of the present invention to provide a method and system for modeling the behavior of a circuit, which generate a compact logical fault model of an integrated circuit from a circuit netlist description.

The foregoing objects are achieved as is now described. A method and system for modeling the behavior of a circuit are disclosed. A list specifying a plurality of transistors within the circuit and interconnections between the plurality of transistors is provided. Each fan node within the circuit is identified, where a fan node is defined as a point of interconnection between two or more of the plurality of transistors from which multiple nonredundant current paths to power, ground, or an input of the circuit exist. A fan node equation set is constructed that expresses a logical state of each fan node of the circuit in response to various transistor gate signal states. In addition, an output node equation is constructed that expresses a logical state of an output node of the circuit in terms of selected fan node logical states and specified transistor gate signal states. In response to receipt of a set of states of inputs to the circuit, a logical state of the output node is determined utilizing the fan node equation set and the output equation in order to model behavior of the circuit.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
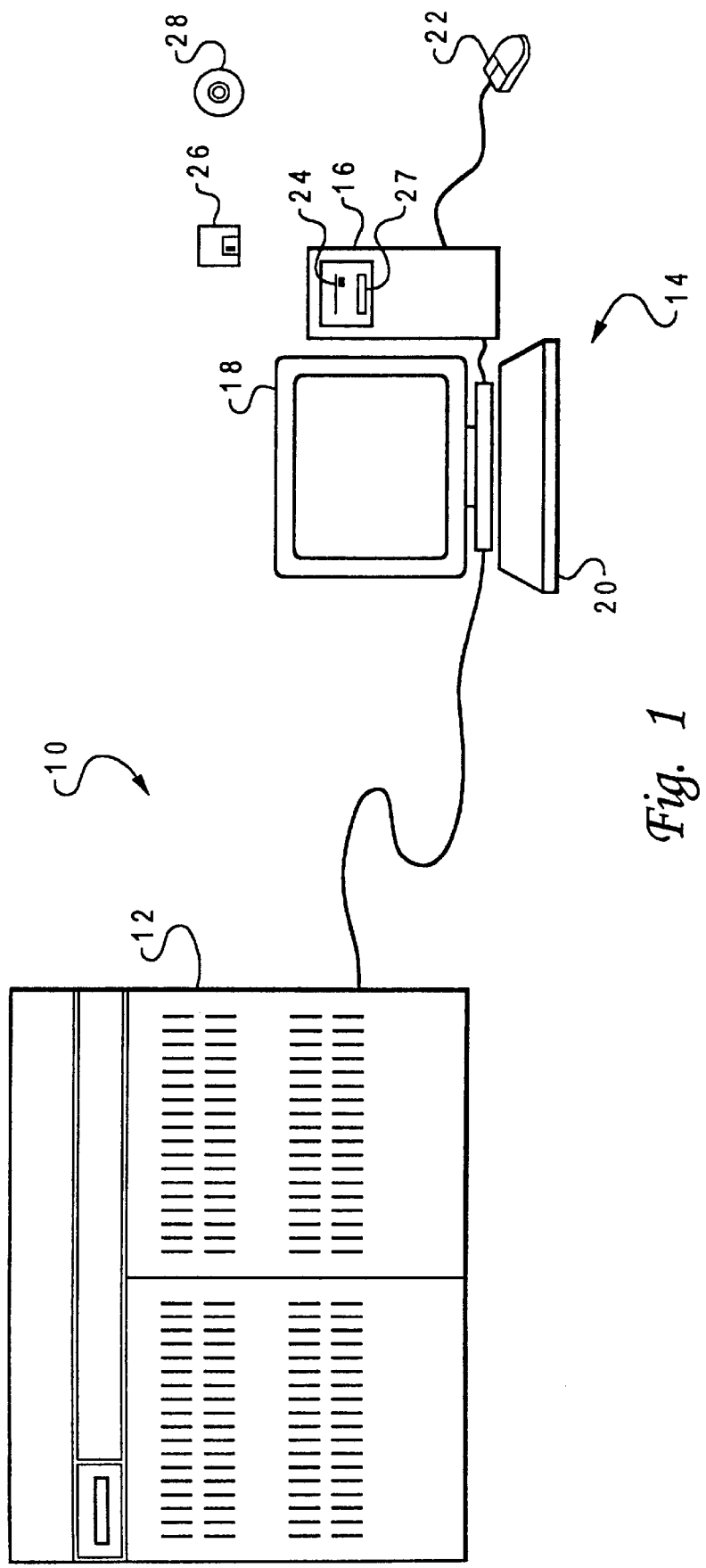
FIG. 1 illustrates an illustrative embodiment of a data processing system which can be utilized to implement the present invention.

With reference now to the figures and in particular with reference to FIG. 1, there is illustrated a preferred embodiment of a data processing system which can be utilized to implement the method and system of the present invention. As illustrated, data processing system 10 comprises system unit 12 and one or more local nodes 14, which include personal computer 16, display device 18, keyboard 20, and mouse 22. As is well known to those skilled in the art, a user can input data and instructions into personal computer 16 utilizing keyboard 20, mouse 22, or other suitable input device. In addition, a user can retrieve data and instructions from recordable media such as diskette 26 and CD-ROM 28 utilizing diskette drive 24 or CD-ROM drive 27, respectively. The user can then process the data and instructions locally utilizing personal computer 16, or transmit the data from personal computer 16 to system unit 12 or another node 14 utilizing well known networking techniques. It is advantageous for a user to send tasks to system unit 12 for execution since system unit 12 can execute tasks in a relatively short period of time compared to personal computer 16. System unit 12 and personal computer 16 output data to a user via display device 18 or in an output file stored within diskette 26 or CD-ROM 28.

Figure 2:
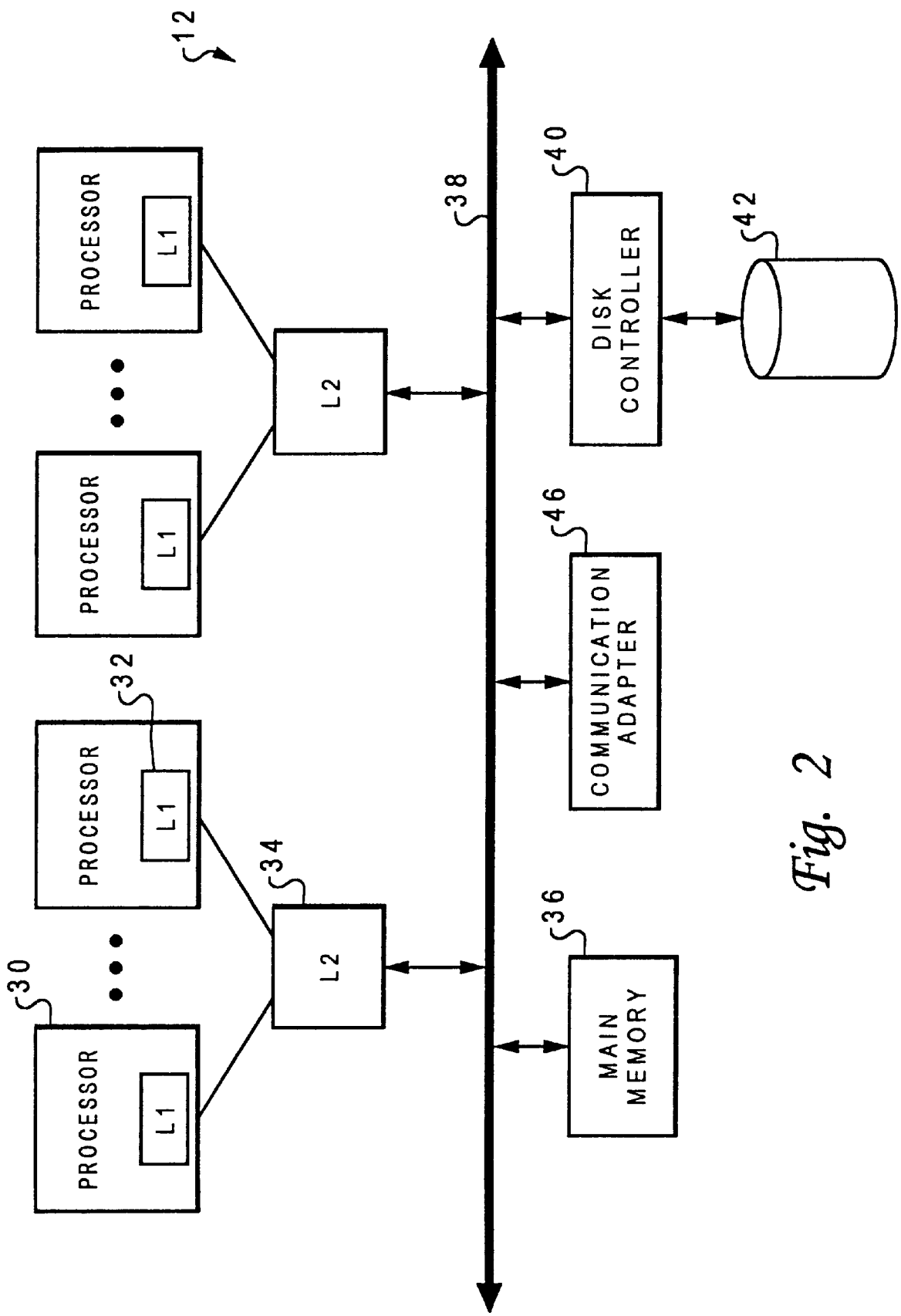
FIG. 2 depicts a high-level block diagram of the system unit of the data processing system illustrated in FIG. 1.

Referring now to FIG. 2, there is depicted a high level block diagram of system unit 12, which preferably comprises a multitasking multiprocessor computer, such as the IBM RISC System/6000. As illustrated, system unit 12 includes one or more processors 30, which are each capable of executing a segment of instructions within one of a number of concurrent processes. The operating system as well as other instructions and data utilized by system unit 12 are distributed between a primary memory hierarchy comprising level one (L1) caches 32, level two (L2) caches 34, and main memory 36, and a secondary memory including hard disk 42, which is coupled to processors 30 via disk controller 40 and system bus 38. System unit 12 also includes communication adapter 46 through which multiple nodes 14 can interface to system resources available within system unit 12. Communication adapter 46 preferably includes facilities by which system unit 12 can communicate with the Internet and World Wide Web. As will be appreciated by those skilled in the art, system unit 12 includes additional hardware coupled to system bus 46 that is not necessary for an understanding of the present invention and is accordingly omitted for simplicity.

Figure 3:
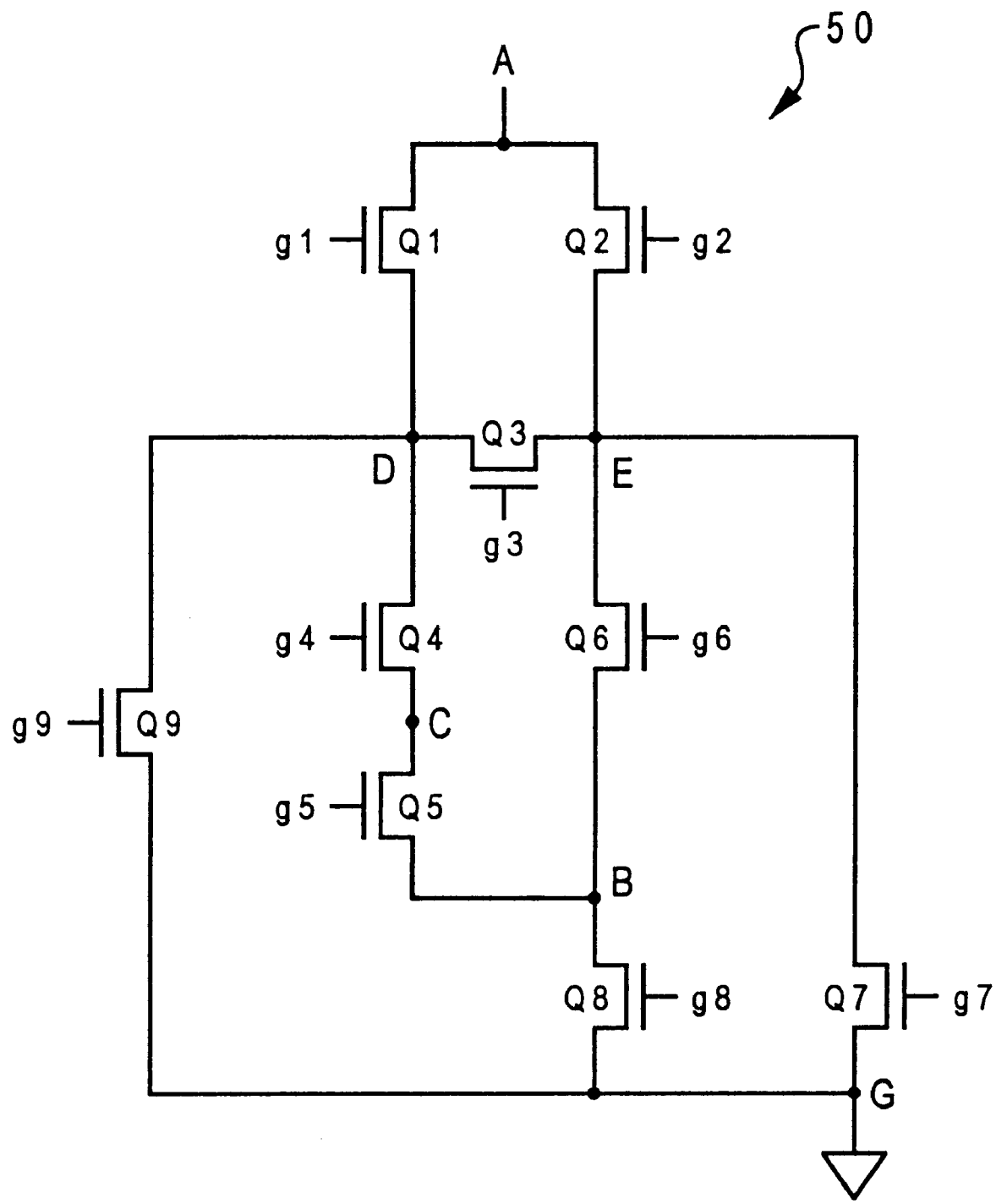
FIG. 3 illustrates an exemplary integrated circuit schematic from which a logical fault model is generated in accordance with the present invention.

With reference now to FIGS. 3–6, there are illustrated several figures which depict through an analysis of an exemplary circuit the method for generating a logical fault model of a VLSI integrated circuit in accordance with the present invention. Referring first to FIG. 3, there is illustrated a schematic representation of an integrated circuit for which the logical fault model is to be generated. As illustrated, integrated circuit 50 includes nine transistors, labelled Q1–Q9, which are interconnected to form nodes A, B, C, D, E, and G. Inputs to circuit 50 comprise the gate signals for each of transistors Q1–Q9, which are labelled g1–g9, respectively; circuit node A is the output node of circuit 50. As is further depicted in FIG. 3, circuit node G provides the electrical ground for circuit 50.

Figure 4:
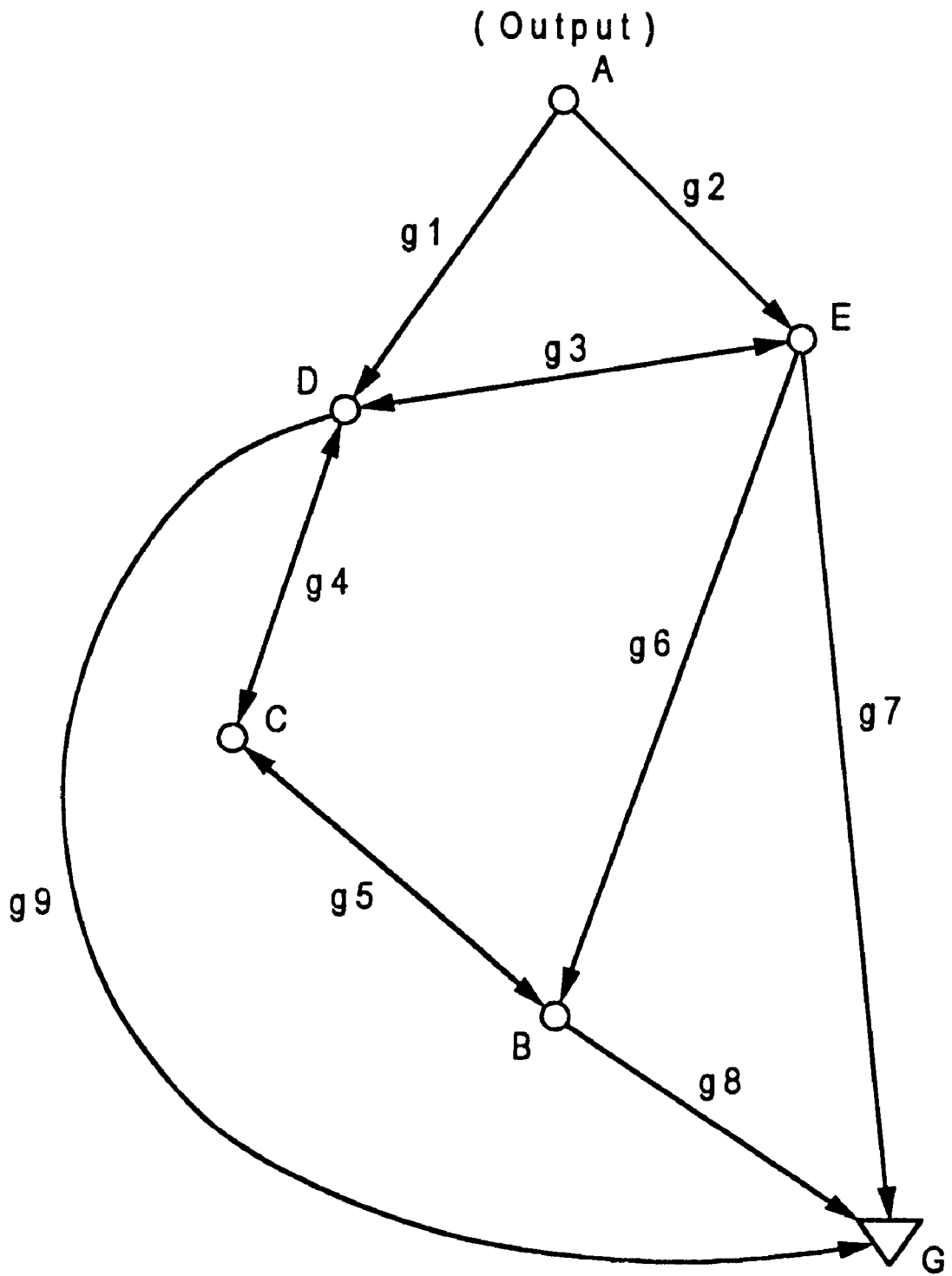
FIG. 4 depicts a current flow diagram of the integrated circuit schematically represented in FIG. 3.

Referring now to FIG. 4, there is depicted a current flow diagram of circuit 50, which illustrates the direction of current flow through each of transistors Q1–Q9. The span between each circuit node illustrated in FIG. 4 is labelled with the appropriate gate signal, which if active permits current to flow in the indicated direction through the associated circuit span. By convention, current is taken to flow from circuit output node A to ground node G, resulting in a "negative" current flow through circuit output node A.

Figure 5:
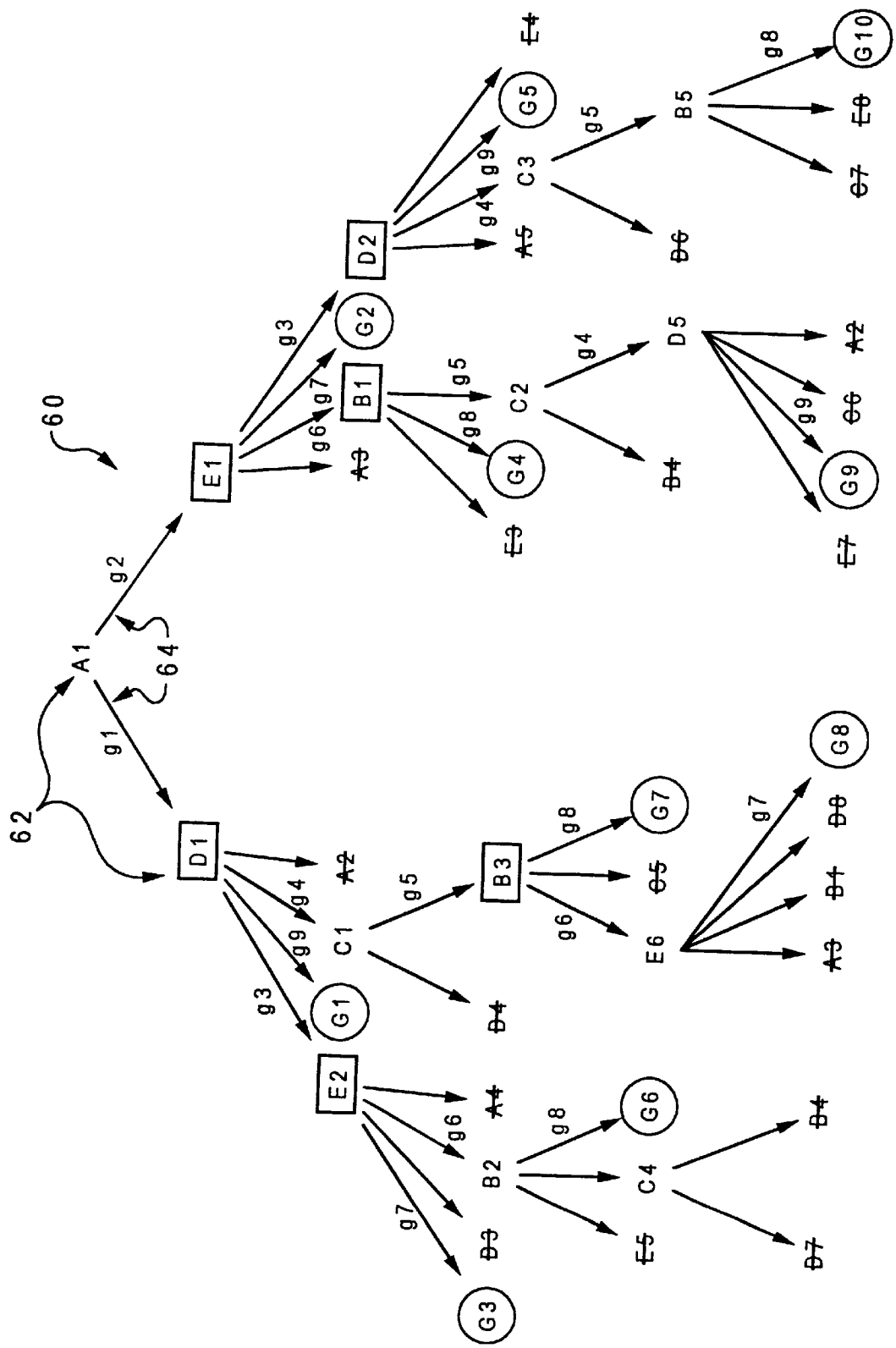
FIG. 5 illustrates a pictorial representation of a tree data structure which is utilized in accordance with a preferred embodiment of the present invention to derive a fan node equation set and an output node equation representative of the fault behavior of the integrated circuit schematically represented in FIG. 3.

With reference now to FIG. 5, there is illustrated a pictorial representation of a tree data structure which is constructed from the current flow diagram depicted in FIG. 4. As illustrated, tree data structure 60 is composed of a number of tree node 62, which each correspond to a circuit node of circuit 50, and a number of branches 64 connecting tree nodes 62. Each branch 64 linking a parent node and a valid child node is labelled with the gate signal of the transistor that, if active, permits current to flow from the parent node to the child node.

To construct tree data structure 60, current is traced from each output node within circuit 50 to a power node, ground node, or input node of circuit 50 through each non-redundant current path. Each circuit node reached during the traversal of circuit 50 is represented by a tree node 62 within tree data structure 60 that is designated with a tag indicating the occurrence of the circuit node. Thus, the first occurrence of circuit node B during current tracing inserts tree node B1 into tree data structure 60, the second occurrence inserts tree node B2, and so on. As circuit 50 is traversed and descendant tree nodes 62 corresponding to the neighboring circuit nodes of a circuit node are inserted into tree data structure 60, tree nodes corresponding to circuit nodes that have already be encountered in the current path are discarded as redundant and therefore invalid. Invalid nodes are depicted in FIG. 5 in strikethrough type. As is further illustrated in FIG. 5, terminal tree nodes, that is, tree nodes 62 that correspond to power nodes, ground nodes or input nodes (i.e., terminal circuit nodes) of circuit 50, are circled. Fan tree nodes, that is, those with two or more valid descendant terminal tree nodes, are enclosed in rectangles.

Utilizing the foregoing rules, tree data structure 60 is constructed as follows. Beginning with output circuit node A, a root tree node 62 is added to tree data structure 60 and labelled A1 as the first occurrence of circuit node A. The span of the circuit labelled g1 is then traversed to circuit node D, for which a corresponding tree node D1 is inserted in tree data structure 60. The branch 64 linking tree node A1 and tree node D1 is labelled g1. Thereafter, descendants of tree node D1 (i.e., tree nodes E2, G1, and C1) are inserted into tree data structure 60 for each neighboring node of circuit node D, except for circuit node A, which has a corresponding tree node 62 that is an ancestor of tree node D1. Because tree node G1 corresponds to ground circuit node G, a terminal circuit node, current tracing along this path stops and tree node G1 has no descendants. Current tracing from tree nodes E2 and C1, however, continues until no further valid tree nodes exist or a power node, ground node or input node of circuit 50 is reached. Returning again to output node A of circuit 50, the other half of tree data structure 60 is similarly constructed by tracing current from output circuit node A to circuit node E and its descendant nodes. After tree data structure 60 has been constructed, equations defining the logical fault model of circuit 50 can then be derived from tree data structure 60.

Utilizing the information contained within tree data structure 60, three types of equations defining the logical fault model of circuit 50 are derived. First, product term equations are derived, which define each possible current path from output circuit node A to a power node, ground node, or input node of circuit 50. A product term equation is formed by logically ANDing the gate control signal associated with each tree branch between a terminal tree node and root tree node A1. Accordingly, the product term equations for tree data structure 60 can be expressed as follows:

G1=(g1)(g9)
G2=(g2)(g7)
G3=(g1)(g3)(g7)
G4=(g2)(g6)(g8)
G5=(g2)(g3)(g9)
G6=(g1)(g3)(g6)(g8)
G7=(g1)(g4)(g5)(g8)
G8=(g1)(g4)(g5)(g6)(g7)
G9=(g2)(g6)(g5)(g4)(g9)
G10=(g2)(g3)(g4)(g5)(g8)

As is apparent from the foregoing product term equations, a current path to ground exists if both gate signals g1 and g9 are both active. Similarly, a second current path to ground exists if gate signals g2 and g7 are both active. Thus, a description of all current paths to ground can be described by logically ORing all of the product term equations together.

Second, a set of fan node equations can be derived from tree data structure 60. As noted above, a fan node of tree data structure 60 is one which corresponds to a circuit node having a plurality of valid current paths to a power node, ground node, or input node of circuit 50. A fan node equation therefore logically describes all of the current paths from a particular circuit fan node to a terminal circuit node in terms of transistor gate signal states and the logical states of other fan nodes. The fan node equation set described by tree data structure 60 can be expressed as follows:

D1=(g9)+(g3)E2+(g4)(g5)B3
E2=(g7)+(g6)(g8)
B3=(g8)+(g6)(g7)
E1=(g3)D2+(g6)B1+(g7)
D2=(g9)+(g4)(g5)(g8)
B1=(g8)+(g5)(g4)(g9)

Thus, for example, a current path from circuit fan node B3 to ground exists if gate signal g8 is active or if both gate signals g6 and g7 are active.

Finally, an output node equation can be simply written as follows: A=−((g1)D1+(g2)E1). As noted above, the output node equation includes a negative sign since current by convention is taken to flow from output circuit node A to ground circuit node G.

Figure 6:
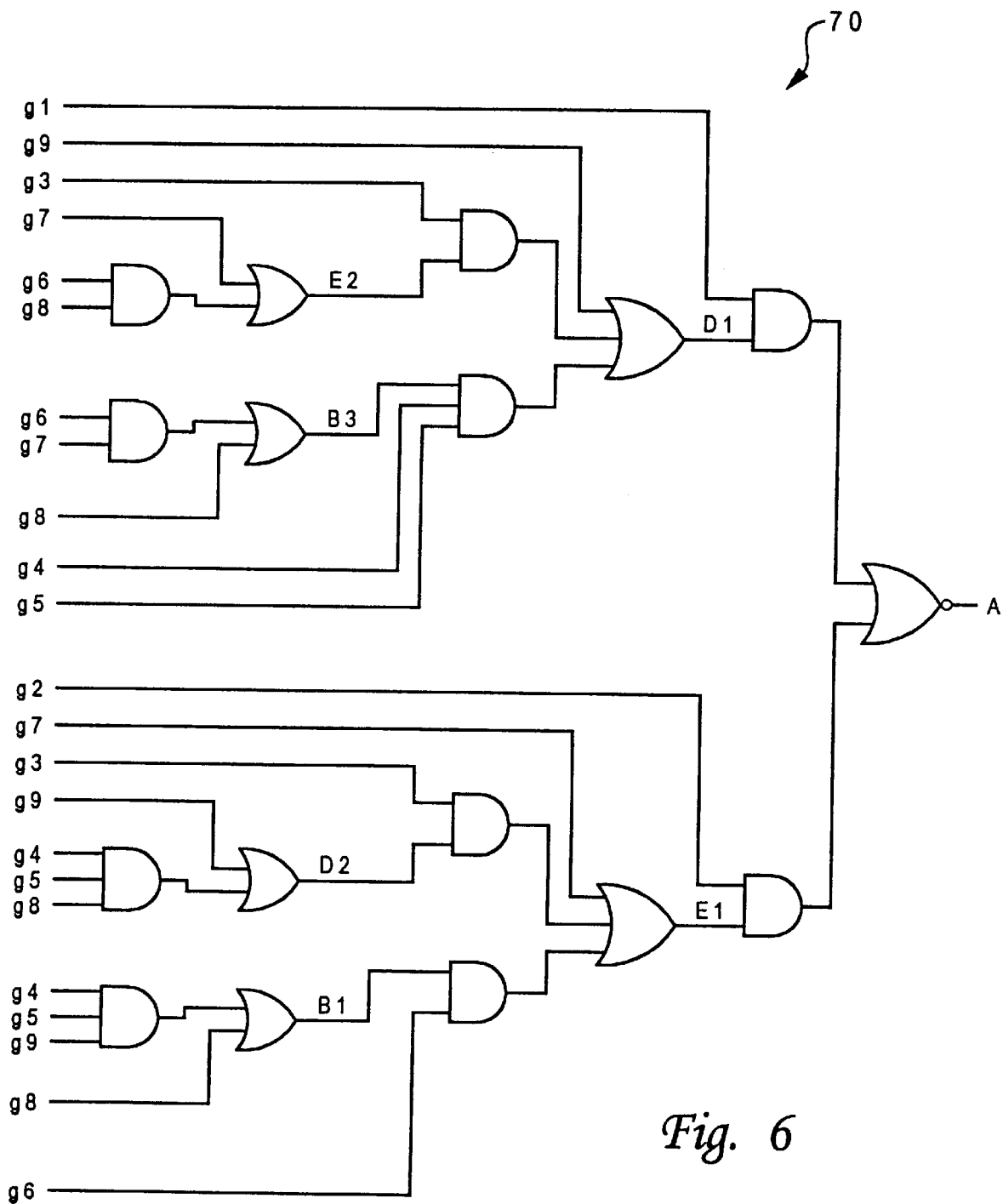
FIG. 6 depicts a logical fault model of the integrated circuit schematically illustrated in FIG. 3, which was generated in accordance with the present invention.

Referring now to FIG. 6, there is depicted a gate-level description of the logical fault model of circuit 50, which can be constructed utilizing the product term, fan node, and output node equations generated above. As is apparent upon inspection of logical fault model 70, each of the functional gates within logical fault model 70 corresponds to a logical operation within the set of fan node equations generated from tree data structure 60. Furthermore, it is apparent from logical fault model 70 that output A will be active low if all of the gate signals within any one of the product term equations are all active. Thus, the fault behavior of circuit 50 can accurately be modelled by applying appropriate test patterns to the gate signal inputs of logical fault model 70.

Figures 7A, 7B:
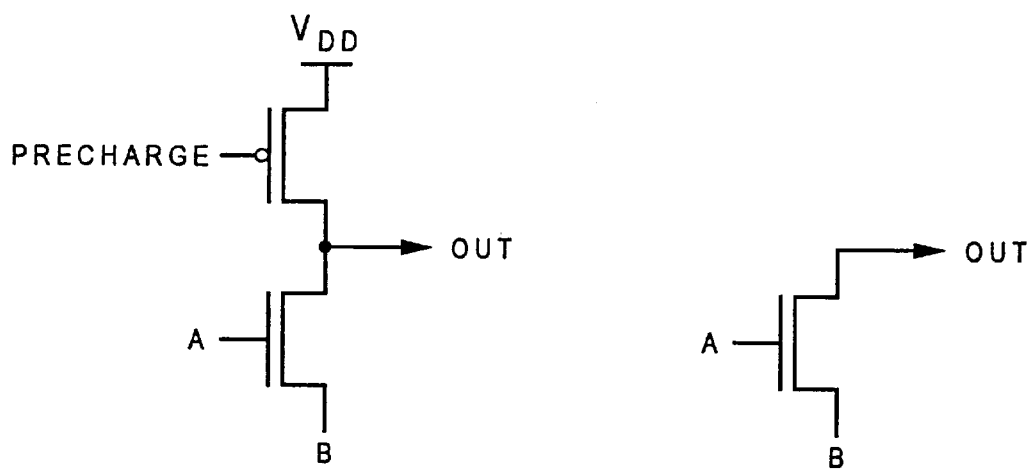
FIGS. 7A and 7B illustrate a circuit having a precharged output node and a circuit without a precharged output node, respectively, for which different logical fault models are generated in accordance with the present invention.

It is important to note that the logical fault model generation process hereinbefore described accurately models an integrated circuit regardless of whether or not the integrated circuit includes precharged gate control or output nodes. With reference now to FIGS. 7A and 7B, there are illustrated pre-charged and non-precharged configurations, respectively, of a switch circuit in which input B is connected directly to the source of a MOSFET. As shown below in Tables 1 and 2, the circuit configurations illustrated in FIGS. 7A and 7B have diverse logical behaviors when gate input signal A is logic low due to the difficulty in representing a circuit exhibiting three logic states with two-valued logic.

TABLE 1

| A | B | OUT | MODEL OUT |
|---|---|---|---|
| 0 | 0 | 1 | 1 |
| 0 | 1 | 1 | 1 |
| 1 | 0 | 0 | 0 |
| 1 | 1 | 1 | 1 |

OUT = −[(A)(−B)]

TABLE 2

| A | B | OUT | MODEL OUT |
|---|---|---|---|
| 0 | 0 | Hi-Z | 0 |
| 0 | 1 | Hi-Z | 0 |
| 1 | 0 | 0 | 0 |
| 1 | 1 | 1 | 1 |

OUT = (A)(B)

The logical fault model for a device having a source or drain node connected to a primary input is generated in accordance with Table 1 to ensure that circuits utilizing precharged nodes in commonly used configurations, such as that illustrated in FIG. 7A, are correctly modelled with two-valued logic.

Figure 8A:
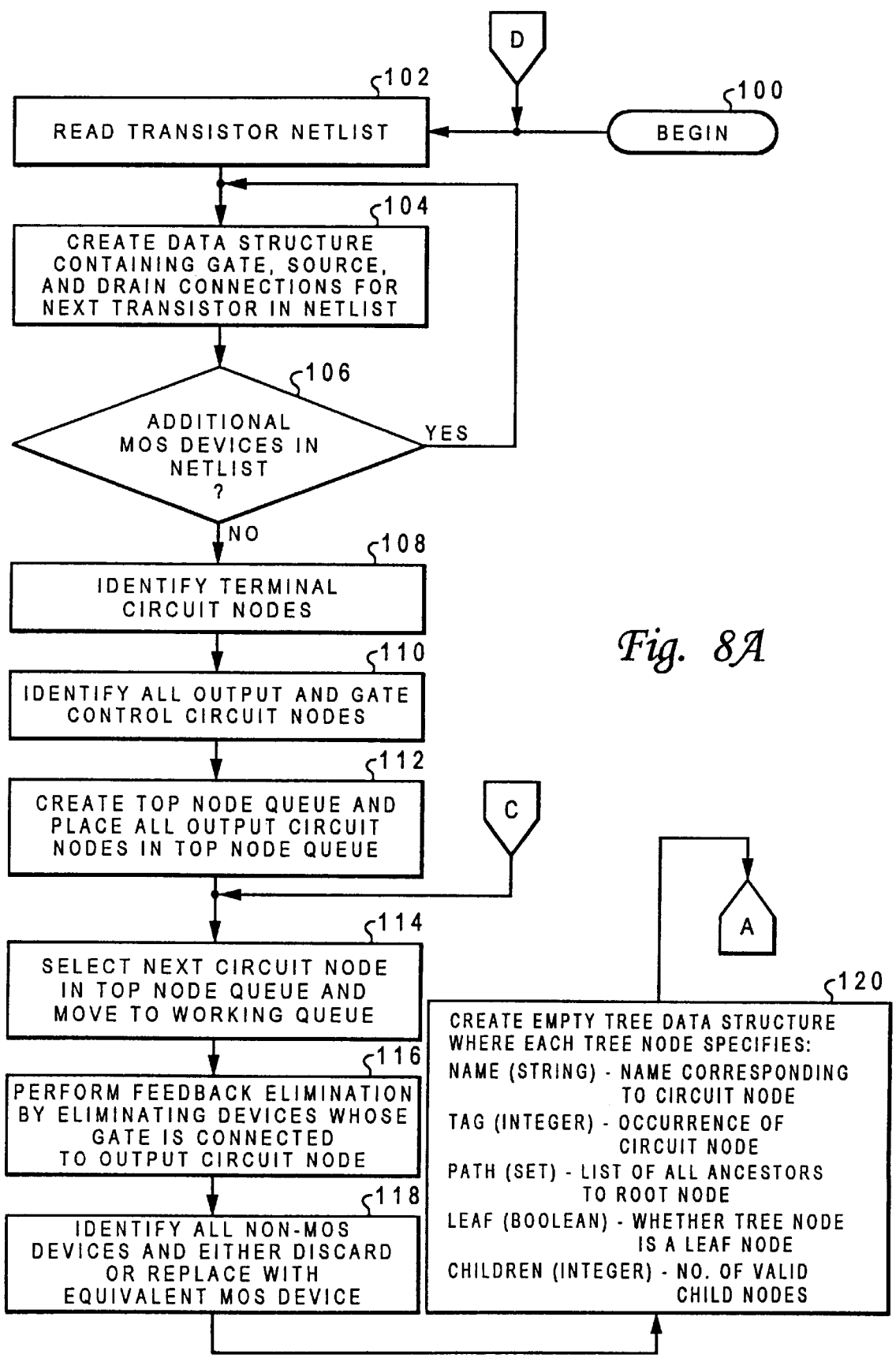
FIGS. 8A–8C are flowcharts which together depict a preferred embodiment of a method for generating a logical fault model of an integrated circuit in accordance with the present invention.
Figure 8B:
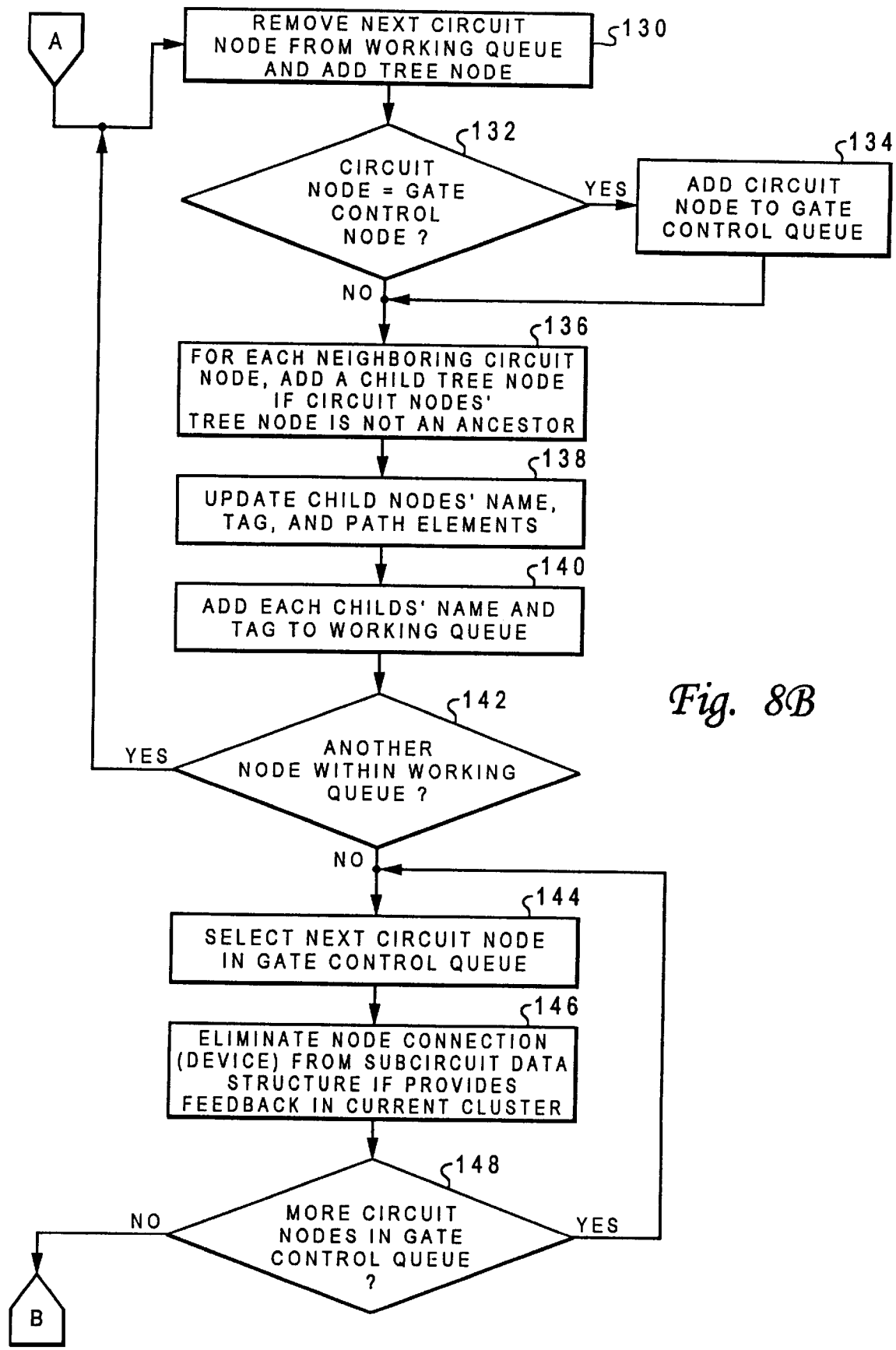
Figure 8C:
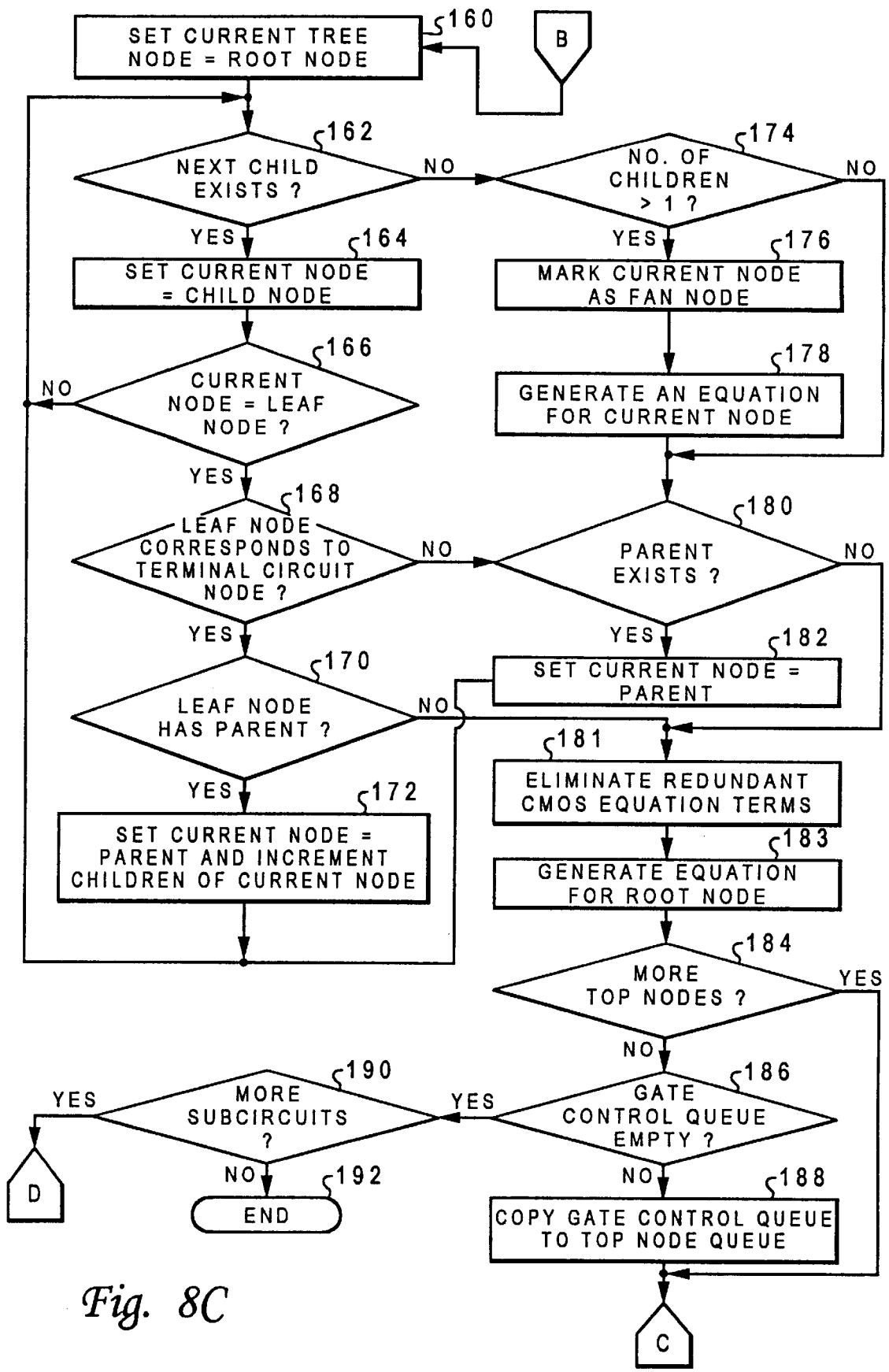

With reference now to FIGS. 8A–8C, there are illustrated three flowcharts, which together illustrate a preferred embodiment of a method for generating a logical fault model of an integrated circuit in accordance with the present invention. The illustrated method is preferably implemented as a software program, such as a VLSI design tool, executing within a data processing system such as that illustrated in FIGS. 1 and 2. However, it will be understood that the present invention can alternatively be embodied within a computer program product within a computer readable media for causing a data processing system to perform the illustrated method.

As illustrated, the process begins at block 100 and then proceeds to block 102, which depicts data processing system 10 reading in a transistor netlist that describes a subcircuit of an integrated circuit. As utilized herein, a subcircuit is a portion of a larger circuit that has defined primary inputs and outputs. Transistor netlists are generally received in a format that lists each circuit node within the subcircuit together with a list of interconnections between the circuit nodes. The process proceeds from block 102 to blocks 104 and 106, which illustrate the creation of a netlist data structure containing gate, source, and drain connections for each transistor within the netlist. Next, the process passes to block 108, which depicts identifying terminal circuit nodes, that is, circuit nodes which are either a power node, ground node, or a primary input node of the current subcircuit. The process proceeds from block 108 to block 110, which illustrates identifying all output and gate control circuit nodes within the netlist data structure. A gate control circuit node is a circuit node that controls the output of another circuit device that is not within the current subcircuit. Next, as depicted at block 112, a "top node" queue is created and all output circuit nodes identified at block 110 are placed within the top node queue. Thereafter, as illustrated at block 114 and following blocks, a tree data structure utilized to perform current tracing is created for each output circuit node within the top node queue.

Figure 9:
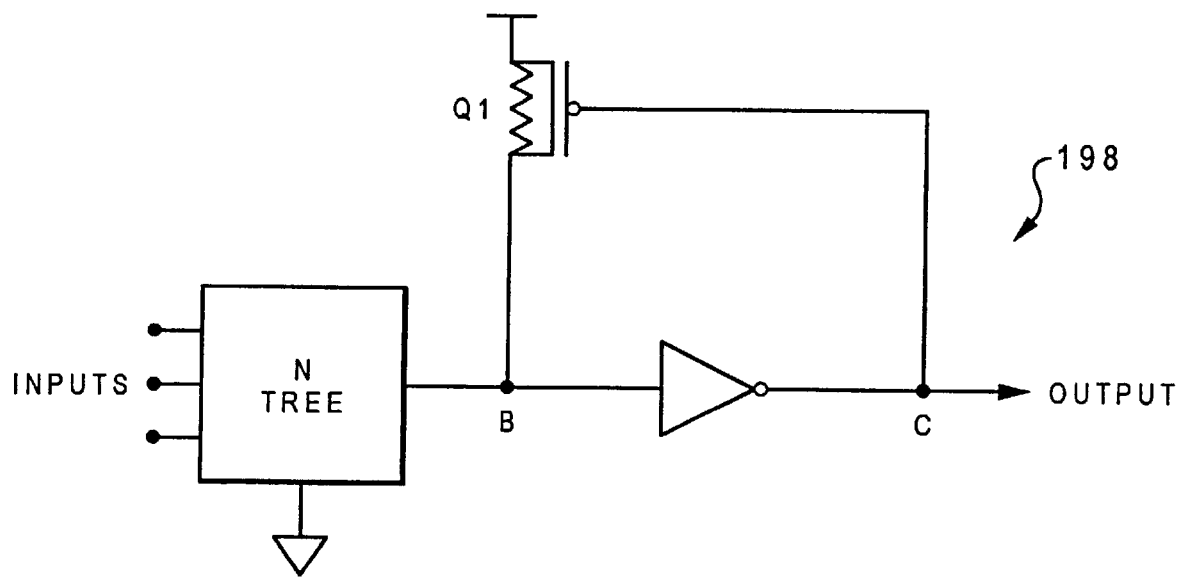
FIG. 9 illustrates a schematic representation of a circuit in which circuit elements within feedback paths are eliminated for the purposes of logical fault model generation in accordance with the present invention.

Thus, referring to block 114, the next circuit node within the top node queue is selected and moved to a working queue. The process proceeds from block 114 to block 116, which depicts performing feedback elimination by eliminating devices from the netlist data structure which have a gate connected to the output circuit node in the working queue. For example, referring now to FIG. 9, there is depicted an illustrative circuit 198 having an output circuit node C, which is coupled by a feedback path through resistive PMOS transistor Q1 to circuit node B. In accordance with the present invention, the feedback elimination performed at block 116 of FIG. 8A would remove transistor Q1 from the subcircuit data structure to eliminate the simple feedback path extending between output circuit node C and circuit node B. Transient feedback paths, however, which exist only during particular cycles of a circuit's operation, are not eliminated at block 116. Any devices within the circuit which are disconnected by the removal of feedback elements are also eliminated from the subcircuit data structure because such disconnected elements no longer provide a valid current path to ground.

Returning to FIG. 8A, the process proceeds from block 116 to block 118, which illustrates identifying all non-MOS devices within the current subcircuit and either discarding or replacing the identified elements with equivalent MOS devices. An integrated circuit may include devices other than transistors, for example, capacitors and resistors, to provide noise reduction and signal delay, respectively. Because capacitors do not provide a current path to ground, capacitors are simply discarded from the netlist data structure. Resistors, on the other hand, are replaced within the netlist data structure by equivalent MOSFET devices. Following block 118, the process passes to block 120, which illustrates creating an empty tree data structure. Each tree node within the tree data structure includes the following elements:

Name(string)-name corresponding to circuit node;
Tag(integer)-occurrence of circuit node within tree data structure;
Path(set)-list of all ancestors between current node and root node;
Leaf(boolean)-whether tree node is a leaf node; and
Children(integer)-number of valid child nodes.

The process proceeds from block 120 through page connector A to blocks 130–148 of FIG. 8B, which illustrate a preferred embodiment of a method for constructing a tree data structure like that depicted in FIG. 5. The process depicted in FIG. 8B begins at block 130, which illustrates removing the next circuit node from the working queue and adding a corresponding tree node to the tree data structure. When block 130 is first executed, the circuit node in the working queue that formerly resided in the top node queue is removed from the working queue and added to the tree data structure as the root node. The process then proceeds to block 132, which depicts determining whether the currently selected circuit node is a gate control circuit node. As described above, all gate control circuit nodes are identified at block 110 of FIG. 8A. If a determination is made that the current circuit node is not a gate control circuit node, the process passes from block 132 to block 136. However, in response to a determination that the current circuit node is a gate control circuit node, the process proceeds to block 134, which illustrates adding the gate control circuit node to a gate control queue. The process then passes to block 136.

Block 136 depicts adding a child tree node to the tree data structure for each circuit node that is a neighbor of the current circuit node if the neighboring circuit nodes do not have a corresponding tree node that is an ancestor of the current tree node. For example, as illustrated in FIG. 5, tree nodes E2, G1, and C1 are inserted as children of tree node D1, but a tree node corresponding to circuit node A is not inserted because root tree node A1 is an ancestor of tree node D1. Next, the process proceeds to block 138, which illustrates updating each child node's Name, Tag, and Path elements. The process proceeds from block 138 to block 140, which depicts adding each child tree node's Name and Tag to the end of the working queue. Thereafter, as illustrated at block 142, if another node is within the working queue, the process returns to block 130.

However, in response to a determination that the working queue is empty, the process proceeds from block 142 to blocks 144–148, which illustrate eliminating elements from within the netlist data structure that are within a feedback path connected to a gate control circuit node. At block 144, the next circuit node within the gate control queue is selected. Then, as illustrated at block 146, each device coupled to the selected gate control circuit node in a simple feedback configuration is eliminated from the netlist data structure. Thereafter, as shown at block 148, the process is repeated for each gate control circuit node within the gate control queue. Following the gate control circuit node feedback elimination performed at blocks 144–148, the process passes to FIG. 8C through page connector B.

Blocks 160–182 of FIG. 8C depict the generation of fan node equations for each fan node within the current tree data structure. As illustrated, the flowchart depicted in FIG. 8C begins at block 160, which illustrates setting a current tree node to the root node of the current tree data structure. The process then passes to block 162, which illustrates a determination of whether or not a child tree node of the current tree node exists. If not, the process passes to block 174, which is described below. However, if a current tree node has a child, the process proceeds to block 164, which depicts setting the current tree node to the child tree node. Then, as depicted at block 166, a determination is made whether or not the current tree node is a leaf node, that is, whether the number of children of the current node is equal to zero. If not, the process returns to block 162, which has been described. However, in response to a determination that the current tree node is a leaf node, the process passes to block 168, which illustrates a determination of whether or not the leaf node corresponds to a terminal circuit node, that is, a ground, power, or primary input circuit node. If not, the process passes to block 180, which is described below. Referring again to block 168, if a determination is made that the leaf node corresponds to a terminal circuit node the process passes block 170, which depicts a determination of whether or not the leaf node has a parent. If not, the process passes to block 181, which is described below. However, in response to a determination that the leaf node has a parent, the process proceeds to block 172, which illustrates setting the current node equal to the parent node and then incrementing the number of children of the current node. The process then returns to block 162, which has been described. In this manner, the process performs a depth-first search of the tree data structure to determine how many children each tree node has. Those skilled in the art will appreciate that the described search could alternatively be performed in a breadth-first manner.

Referring again to block 162, if a determination is made that the current tree node has no more children remaining to be processed, the process passes to block 174, which illustrates a determination of whether or not the number of child nodes of the current tree node is greater that one. If not, the process passes to block 180. However, in response to a determination that the number of child nodes of the current tree node is greater than one, the process passes from block 174 to block 176, which illustrates marking the current tree node as a fan node. Then, as depicted at block 178, an equation is generated for the current tree node. As described above with reference to FIG. 5, an equation is generated for a fan node by logically ORing each current path from the fan node to a terminal node, where each current path to a terminal node is expressed as a logical ANDing of the gate states of transistors within the path from the fan node to the terminal node. The process then passes from either block 174 or block 178 to block 180, which illustrates a determination of whether or not a parent node of the current tree node exists. If not, the process passes to block 181. However, if a parent node of the current tree node exists, the process proceeds to block 182, which illustrates setting the current node to the parent tree node. Thereafter, the process returns to block 162 in the manner which has been described.

Referring now to block 181, following the derivation of fan node equations for the subcircuit, any redundant equation terms representing a complementary PMOS tree are eliminated by pattern matching. Next, at block 183 an equation is derived for the root node of the tree data structure that expresses the state of the root node in terms of one or more fan node and gate control signal states. A determination is then made at block 184 whether more circuit nodes reside within the top node queue. If so, the process returns to block 114 of FIG. 8A via page connector C for further processing of output circuit nodes of the current subcircuit. However, if no more output circuit nodes are within the top node queue, the process proceeds from block 184 to block 186, which depicts a determination of whether or not the gate control queue is empty. If not, the gate control circuit nodes within the gate control queue are copied to the top node queue. The process then returns to block 114 of FIG. 8A for processing of each gate control circuit node in the manner which has been described.

Figure 10:
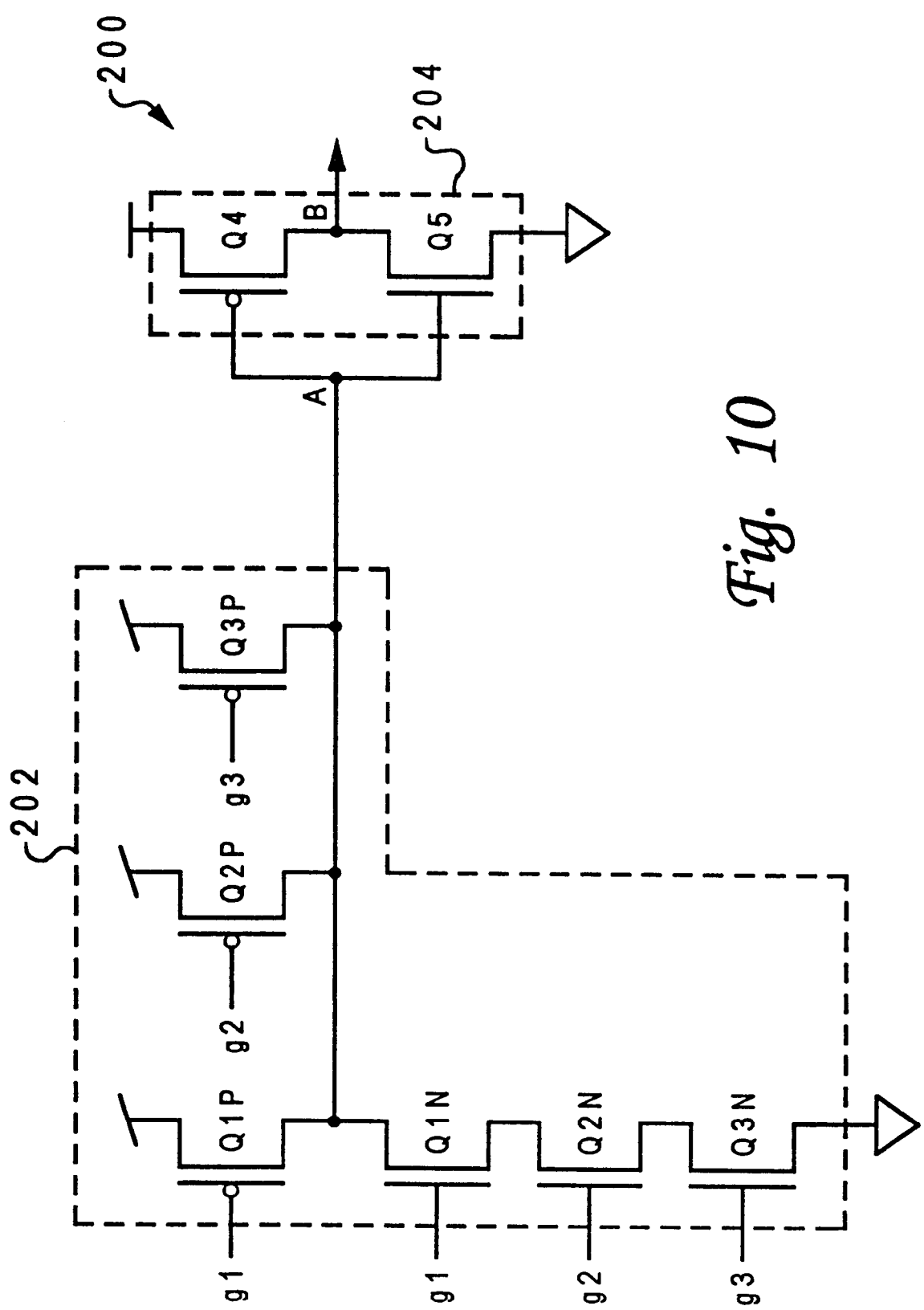
FIG. 10 depicts a schematic representation of a circuit including both an output and a gate control node, wherein the overall logical fault model for the circuit is derived in accordance with the present invention by subdividing the circuit and analyzing the output and gate control nodes individually.

For example, with reference now to FIG. 10, there is depicted an exemplary subcircuit 200 having both an output circuit node B and a gate control circuit node A. As illustrated, circuit 200 includes an inverter 204, comprising transistors Q4 and Q5, and a three-input NAND gate 202, comprising NMOS transistors Q1N–Q3N and PMOS transistors Q1P–Q3P configured in a fully complementary arrangement. Because no static current (except leakage current) flows between NAND gate 202 and inverter 204, subcircuit 200 can be naturally subdivided into a first partition associated with output circuit node B and a second partition associated with gate control circuit node A. In accordance with the method for generating a fault model of an integrated circuit illustrated in FIG. 8A–8C, the output node equation B=−A is first derived from a tree data structure corresponding to inverter 204. Following the derivation of the equation representing the fault behavior of the first subcircuit partition, a determination is made at block 186 of FIG. 8C that the gate control queue contains gate control circuit node A. Thereafter, the process passes to block 114 of FIG. 8A and following blocks, which depict the construction of a tree data structure corresponding to NAND gate 202. By combining the output node equation with the gate control node equation A=−[(g1)(g2)(g3)], which represents the fault behavior of the second subcircuit partition, the overall fault behavior of the subcircuit illustrated in FIG. 10 can be given by the equation B=(g1)(g2)(g3). Thus, the method of fault model generation depicted in FIG. 8A–8C derives the fault behavior of a subcircuit by individually analyzing each subcircuit partition.

Referring again to block 186 of FIG. 8C, if a determination is made that the gate control queue is empty, indicating that tree data structures have been created for all output circuit nodes and all gate control circuit nodes, the process passes to block 190, which illustrates a determination of whether or not more the integrated circuit includes additional subcircuits that have not been processed. If so, the process returns to block 102 of FIG. 8A in order to process the remaining subcircuits within the integrated circuit. Once all subcircuits within the integrated circuit have been processed, the process passes from block 190 to block 192 and terminates. Following the generation of a logical fault model for each subcircuit within an integrated circuit in the manner which has been described above, each subcircuit can be replaced by a "black box" having the logical fault behavior of the associated subcircuit. Thus, multiple fault models may be combined hierarchically to model the fault behavior of more complex circuits incorporating multiple subcircuits.

As has been described, the present invention provides an improved method and system for modeling the fault behavior of an integrated circuit. Through its use of feedback elimination and current tracing with fan node analysis, the present invention provides an integrated circuit fault model which is both compact and accurate regardless of the existence of precharged nodes within the integrated circuit.

In one embodiment, the present invention may be implemented as a computer program product for use within a data processing system such as that illustrated in FIG. 1. Such implementation may comprise a series of computer-readable instructions either fixed in a tangible medium, such as a diskette 26, CD-ROM 28, main memory 36, or a hard disk 42, or within a transmission medium, including those utilizing both digital and analog transmission techniques. The series of computer-readable instructions can embody all or part of the functionality previously described herein. Those skilled in the art will appreciate that such computer-readable instructions can be written in a number of programming languages for use with many computer architectures or operating systems. It is contemplated that such a computer program product may be distributed as a removable media with accompanying printed or electronic documentation, preloaded within a data processing system, or distributed from a server or electronic bulletin board over a network, such as the Internet or World Wide Web.

While the invention has been particularly shown and described with reference to a preferred embodiment, it will be understood by those skilled in the art that various changes in form and detail may be made therein without departing from the spirit and scope of the invention.

What is claimed is:

1. A method for modeling the behavior of a circuit, said method comprising:

providing a list of a plurality of transistors within said circuit and specifying interconnections between said plurality of transistors, wherein said step of providing a list of a plurality of transistors within said circuit includes:

providing a list of components within said circuit including a plurality of transistors and one or more non-transistor components; and a replacing each non-transistor component within said list with an equivalent transistor circuit or open circuit;

identifying each fan node within said circuit, wherein a fan node is a point of interconnection between two or more of said plurality of transistors from which a plurality of nonredundant current paths to power, ground, or an input of said circuit exist;

constructing a fan node equation set expressing a logical state of each fan node of said circuit in response to various transistor gate signal states;

constructing an output node equation that expresses a logical state of an output node of said circuit in terms of selected fan node logical states and specified transistor gate signal states; and in response to receipt of a set of states of inputs to said circuit, determining a logical state of said output node utilizing said fan node equation set and said output equation in order to model behavior of said circuit.

2. The method for modeling the behavior of a circuit of claim 1, wherein said step of identifying each fan node within said circuit comprises:

constructing a tree data structure representative of said circuit, said tree data structure including a plurality of tree nodes which each correspond to a circuit node within a nonredundant path from said output node to a power node, ground node, or input node of said circuit;

traversing said tree data structure to identify each tree node having a plurality of descendant tree nodes that each correspond to a power node, ground node, or input node of said circuit; and identifying as a fan node each circuit node corresponding to said identified tree nodes.

3. The method for modeling the behavior of a circuit of claim 2, wherein said step of constructing a tree data structure comprises:

inserting a root tree node corresponding to said output node of said circuit within said tree data structure; and inserting one or more descendant tree nodes within said tree data structure that each correspond to a circuit node within a path from said output node to a power node, ground node, or input node of said circuit, wherein said tree data structure can include multiple descendant tree nodes that correspond to a particular circuit node, provided no more than one of said multiple descendant tree nodes appear within each path between said root tree node and a descendant tree node corresponding to a power node, ground node, or input node of said circuit.

4. The method for modeling the behavior of a circuit of claim 3, wherein each pair of ancestor and descendant tree nodes within said tree data structure is logically linked by a branch corresponding to a transistor gate signal state of a transistor in said circuit connecting circuit nodes corresponding to said pair of ancestor and descendant tree nodes, said step of constructing a fan node equation set comprising:

forming an equation for each fan tree node by traversing a subtree of said each fan tree node and logically summing logical products of transistor gate signal states corresponding to each branch between said each fan node and a descendant node corresponding to a power node, ground node, or input node of said circuit.

5. The method for modeling the behavior of a circuit of claim 1, and further comprising:

partitioning said circuit into a plurality of subcircuits; and performing said steps of identifying each fan node, constructing a fan node equation set, and constructing an output equation for each of said plurality of subcircuits.

6. A method for modeling the behavior of a circuit having an output node, said method comprising:

providing a list of a plurality of transistors within said circuit and specifying interconnections between said plurality of transistors;

removing transistors from said list that are coupled to said output node of said circuit in a feedback configurations;

identifying each fan node within said circuit, wherein a fan node is a point of interconnetion between two or more of said plurality of transistors from which a plurality of nonredundant current paths to power, ground, or an input of said circuit exist;

constructing a fan node equation set expressing a logical state of each fan node of said circuit in response to various transistor gate signal states;

constructing an output node equation that expresses a logical state of the output node of said circuit in terms of selected fan node logical states and specified transistor gate signal states; and in response to receipt of a set of states of inputs to said circuit, determining a logical state of said output node utilizing said fan node equation set and said output equation in order to model behavior of said circuit.

7. A system for modeling the behavior of a circuit, said system comprising:

means for providing a list of a plurality of transistors within said circuit and specifying interconnections between said plurality of transistors, wherein said means for providing a list of a plurality of transistors within said circuit includes:

means for providing list of components within said circuit including a plurality of transistors and one or more non-transistor components; and means for replacing each non-transistor component within said list with an equivalent transistor circuit or open circuit;

means for identifying each fan node within said circuit, wherein a fan node is a point of interconnection between two or more of said plurality of transistors from which a plurality of nonredundant current paths to power, ground, or an input of said circuit exist;

is means for constructing a fan node equation set expressing a logical state of each fan node of said circuit in response to various transistor gate signal states;

is means for constructing an output node equation that expresses a is logical state of an output node of said circuit in terms of selected fan node logical states and specified transistor gate signal states; and means, responsive to receipt of a set of states of inputs to said circuit, for determining a logical state of said output node utilizing said fan node equation set and said output equation in order to model behavior of said circuit.

8. The system for modeling the behavior of a circuit of claim 7, wherein said means for identifying each fan node within said circuit comprises:

a tree data structure representative of said circuit stored within a memory, said tree data structure including a plurality of tree nodes which each correspond to a circuit node within a nonredundant path from said a output node to a power node, ground node, or input node of said circuit;

means for traversing said tree data structure to identify each tree node having a plurality of descendant tree nodes that each correspond to a power node, ground node, or input node of said circuit; and means for identifying as a fan node each circuit node corresponding to said identified tree nodes.

9. The system for modeling the behavior of a circuit of claim 8, wherein said tree data structure comprises:

a root tree node corresponding to said output node of said circuit within said tree data structure; and one or more descendant tree nodes within said tree data structure that each correspond to a circuit node within a path from said output node to a power node, ground node, or input node of said circuit, wherein said tree data structure can include multiple descendant tree nodes that correspond to a particular circuit node, provided no more than one of said multiple descendant tree nodes appear within each path between said root tree node and a descendant tree node corresponding to a power node, ground node, or input node of said circuit.

10. The system for modeling the behavior of a circuit of claim 9, wherein each pair of ancestor and descendant tree nodes within said tree data structure is logically linked by a branch corresponding to a transistor gate signal state of a transistor in said circuit connecting circuit nodes corresponding to said pair of ancestor and descendant tree nodes, said means for constructing a fan node equation set comprising:

means for forming an equation for each fan tree node by traversing a subtree of said each fan tree node and logically summing logical products of transistor gate signal states corresponding to each branch between said each fan node and a descendant node corresponding to a power node, ground node, or input node of said circuit.

11. The system for modeling the behavior of a circuit of claim 7, and further comprising:

means for partitioning said circuit into a plurality of subcircuits; and means for identifying each fan node, constructing a fan node equation set, and constructing an output equation for each of said plurality of subcircuits.

12. A system for modeling the behavior of a circuit having an output node, said system comprising:

means for providing a list of a plurality of transistors within said circuit and specifying interconnections between said plurality of transistors;

means for removing transistors from said list that are coupled to said output node of said circuit in a feedback configuration;

means for identifying each fan node within said circuit, wherein a fan node is a point of interconnection between two or more of said plurality of transistors from which a plurality of nonredundant current paths to power, ground, or an input of said circuit exist;

means for constructing a fan node equation set expressing a logical state of each fan node of said circuit in response to various transistor gate signal states;

means for constructing an output node equation that expresses a logical state of the output node of said circuit in terms of selected fan node logical states and specified transistor gate signal states; and means, responsive to receipt of a set of states of inputs to said circuit, for determining a logical state of said output node utilizing said fan node equation set and said output equation in order to model behavior of said circuit.

13. A computer program product within a computer usable media for modeling a behavior of a circuit, said computer program product comprising:

computer readable code for causing a computer to receive as an input a list of a plurality of transistors within said circuit and interconnections between said plurality of transistors, wherein said computer readable code for causing a computer to receive a list of a plurality of transistors within said circuit as an input includes:

computer readable code for causing a computer to receive a list of components within said circuit including a plurality of transistors and one or more non-transistor components; and computer readable code for causing a computer to replace each non-transistor component within said list with an equivalent transistor circuit or open circuit;

computer readable code for causing a computer to identify each fan node within said circuit, wherein a fan node is a point of interconnection between two or more of said plurality of transistors from which a plurality of non-redundant current paths to power, ground, or an input of said circuit exist;

is computer readable code for causing a computer to construct a fan node equation set expressing a logical state of each fan node of said circuit in response to various transistor gate signal states;

computer readable code for causing a computer to construct an output node equation that expresses a logical state of an output node of said circuit in terms of selected fan node logical states and specified transistor gate signal states; and computer readable code for causing a computer to determine a logical state of said output node utilizing said fan node equation set and said output equation in order to model behavior of said circuit in response to receipt of a set of states of inputs to said circuit.

14. The computer program product of claim 13, wherein said computer readable code for causing a computer to identify each fan node within said circuit comprises:

computer readable code for causing a computer to construct a tree data structure representative of said circuit, said tree data structure including a plurality of tree nodes which each correspond to a circuit node within a nonredundant path from said output node to a power node, ground node, or input node of said circuit;

computer readable code for causing a computer to traverse said tree data structure to identify each tree node having a plurality of descendant tree nodes that each correspond to a power node, ground node, or input node of said circuit; and computer readable code for causing a computer to identify as a fan node each circuit node corresponding to said identified tree nodes.

15. The computer program product of claim 14, wherein said computer readable code for causing a computer to construct a tree data structure comprises:

computer readable code for causing a computer to insert a root tree node corresponding to said output node of said circuit within said tree data structure; and computer readable code for causing a computer to insert one or more descendant tree nodes within said tree data structure that each correspond to a circuit node within a path from said output node to a power node, ground node, or input node of said circuit, wherein said tree data structure can include multiple descendant tree nodes that correspond to a particular circuit node, provided no more than one of said multiple descendant tree nodes appear within each path between said root tree node and a descendant tree node corresponding to a power node, ground node, or input node of said circuit.

16. The computer program product of claim 15, wherein each pair of ancestor and descendant tree nodes within said tree data structure is logically linked by a branch corresponding to a transistor gate signal state of a transistor in said circuit connecting circuit nodes corresponding to said pair of ancestor and descendant tree nodes, said computer readable code for causing a computer to construct a fan node equation set comprising:

computer readable code for causing a computer to form an equation for each fan tree node by traversing a subtree of said each fan tree node and logically summing logical products of transistor gate signal states corresponding to each branch between said each fan node and a descendant node corresponding to a power node, ground node, or input node of said circuit.

17. The computer program product of claim 13, and further comprising:

computer readable code for causing a computer to partition said circuit into a plurality of subcircuits; and computer readable code for causing a computer to identify each fan node, construct a fan node equation set, and construct an output equation for each of said plurality of subcircuits.

18. A computer program product within a computer usable media for modeling a behavior of a circuit having an output node, said computer program product comprising:

computer readable code for causing a computer to receive as an input a list of a plurality of transistors within said circuit and interconnections between said plurality of transistors;

computer readable code for causing a computer to remove transistors from said list that are coupled to said output node of said circuit in a feedback configuration;

computer readable code for causing a computer to identify each fan node within said circuit, wherein a fan node is a point of interconnection between two or more of said plurality of transistors from which a plurality of nonredundant current paths to power, ground, or an input of said circuit exist;

computer readable code for causing a computer to construct a fan node equation set expressing a logical state of each fan node of said circuit in response to various transistor gate signal states;

computer readable code for causing a computer to construct an output node equation that expresses a logical state of the output node of said circuit in terms of selected fan node logical states and specified transistor gate signal states; and computer readable code for causing a computer to determine a logical state of said output node utilizing said fan node equation set and said output equation in order to model behavior of said circuit in response to receipt of a set of states of inputs to said circuit.

* * * * *

UNITED STATES PATENT AND TRADEMARK OFFICE
CERTIFICATE OF CORRECTION

PATENT NO. : 5,920,489
DATED : July 6, 1999
INVENTOR(S) : Dibrino et al.

It is certified that error appears in the above-identified patent and that said Letters Patent is hereby corrected as shown below:

In column 13, line 4, please delete "is".

In column 13, line 22, please delete the second instance of "a".

In column 14, line 49, please delete "is".

Signed and Sealed this

Eighteenth Day of April, 2000

Attest:

Q. TODD DICKINSON

Attesting Officer      *Director of Patents and Trademarks*